(12) United States Patent
Omura et al.

(10) Patent No.: US 7,670,891 B2
(45) Date of Patent: Mar. 2, 2010

(54) METHOD OF MANUFACTURING SEMICONDUCTOR DEVICE

(75) Inventors: Mitsuhiro Omura, Kawasaki (JP); Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1056 days.

(21) Appl. No.: 11/220,687

(22) Filed: Sep. 8, 2005

(65) Prior Publication Data

US 2006/0057828 A1    Mar. 16, 2006

(30) Foreign Application Priority Data

Sep. 10, 2004   (JP)   .............. 2004-263463
Jun. 27, 2005   (JP)   .............. 2005-186853

(51) Int. Cl.
*H01L 21/336* (2006.01)

(52) U.S. Cl. ............. 438/197; 438/585; 438/595; 257/E21.409

(58) Field of Classification Search ........ 438/595, 438/197, 299, 303, 305, 485; 257/E21.409
See application file for complete search history.

(56) References Cited

U.S. PATENT DOCUMENTS

| 5,484,749 | A |   | 1/1996 | Maeda et al. |
|---|---|---|---|---|
| 6,104,063 | A | * | 8/2000 | Fulford et al. ............ 257/344 |
| 6,225,236 | B1 |   | 5/2001 | Nishimoto et al. |
| 6,429,084 | B1 | * | 8/2002 | Park et al. ............ 438/305 |
| 6,869,839 | B2 | * | 3/2005 | Lee et al. ............ 438/238 |
| 2002/0160592 | A1 | * | 10/2002 | Sohn ............ 438/535 |

FOREIGN PATENT DOCUMENTS

| JP | 59-27528 | 2/1984 |
|---|---|---|
| JP | 60-210876 | 10/1985 |
| JP | 2000-31267 | 1/2000 |
| JP | 2003-234325 | 8/2003 |
| JP | 2004-71973 | 3/2004 |

OTHER PUBLICATIONS

Hokazono et al., "14 nm Gate Length CMOSFETs Utilizing Low Thermal Budget Process with Poly-SiGe and Ni Salicide", IEDM Tech. Dig., 957, pp. 649-642, (2002).

A Reasons for Rejection mailed by the Japanese Patent Office on Jul. 21, 2009, for Japanese Application No. 2005-186853, and English-language translation thereof.

* cited by examiner

*Primary Examiner*—Michael Trinh
(74) *Attorney, Agent, or Firm*—Finnegan, Henderson, Farabow, Garrett & Dunner, L.L.P.

(57) ABSTRACT

A method of manufacturing a semiconductor device is disclosed which comprises forming a gate structure on a major surface of a semiconductor substrate with a gate insulating film interposed therebetween, forming a first insulating film to cover top and side surfaces of the gate structure and the major surface of the semiconductor substrate, reforming portions of the first insulating film which cover the top surface of the gate structure and the major surface of the semiconductor substrate by an anisotropic plasma process using a gas not containing fluorine, and removing the reformed portions of the first insulating film.

6 Claims, 6 Drawing Sheets

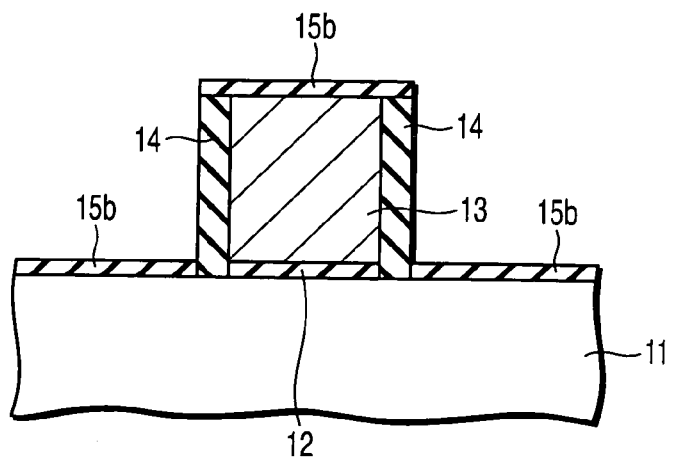
F I G. 7
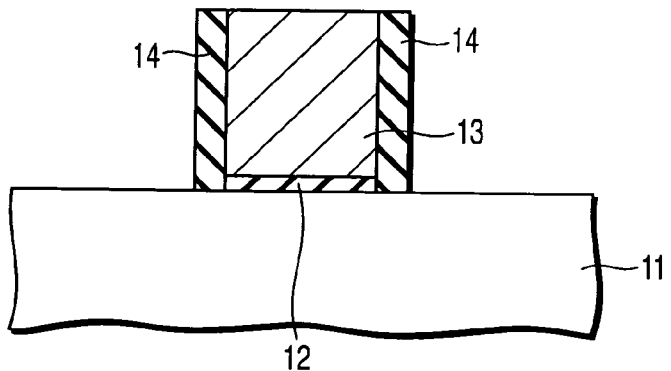
F I G. 8
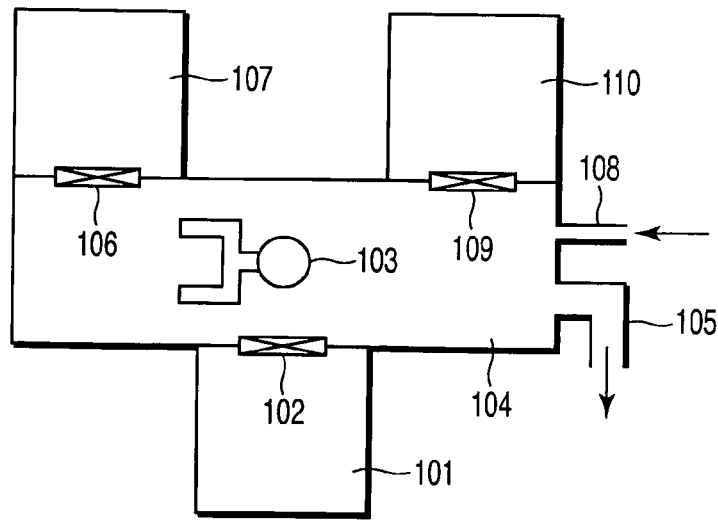
F I G. 9

METHOD OF MANUFACTURING SEMICONDUCTOR DEVICE

CROSS-REFERENCE TO RELATED APPLICATIONS

This application is based upon and claims the benefit of priority from prior Japanese Patent Applications No. 2004-263463, filed Sep. 10, 2004, and No. 2005-186853, filed Jun. 27, 2005, the entire contents of both of which are incorporated herein by reference.

BACKGROUND OF THE INVENTION

1. Field of the Invention

The present invention relates to a method of manufacturing a semiconductor device.

2. Description of the Related Art

The sidewall spacer formed on the side of a gate electrode is one of the key elements in forming semiconductor devices having excellent characteristics (see, for example, A. Hokazono et al., "14 nm Gate Length CMOSFETs Utilizing Low Thermal Budget Process with Poly-Si Ge and Ni Salicide" IEDM Tech. Dig., 957, pp 639-642, 2002). As the dimensions of semiconductor devices are scaled down, it has become increasingly difficult to ensure the processing accuracy of sidewall spacers.

The sidewall spacer is usually formed in the following manner: First, a film of silicon oxide or silicon nitride as an insulating film for the spacer is formed so as to cover a gate electrode. Subsequently, the spacer insulating film is subjected to anisotropic etching by RIE using a fluorocarbon-based gas ($CF_4$, $CHF_3$, etc.). Thereby, the sidewall spacer is formed only on the side of the gate electrode. In this anisotropic etching, in order to make as small as possible the amount by which the silicon substrate is etched, it is required to make high the etch selectivity (selective ratio) of spacer insulating film to silicon substrate. The sidewall spacer is used as a mask for ion implantation of impurities for forming source/drain regions. In order to increase the masking accuracy, therefore, it is desired that the sidewall spacer be vertical in profile (sectional shape).

In order to increase the etch selectivity, it is required to increase the ratio of carbon to fluorine (C/F) in the etching gas. However, increasing the carbon-to-fluorine ratio results in a tapered sidewall spacer with the base widened; that is, the sidewall spacer fails to have vertical profile. Conversely, lowering the carbon-to-fluorine ratio makes it possible to make the sidewall spacer vertical in profile but results in the lowered etch selectivity, which increases the amount by which the silicon substrate is etched.

Thus, if the sidewall spacer is formed by means of plasma etching using a gas containing fluorine such as a fluorocarbon-based gas, it is difficult to provide high etch selectivity of spacer insulating film to silicon substrate and to form a sidewall spacer vertical in profile. For this reason, it is difficult to obtain a sidewall spacer in a desired processed state.

In addition, as the dimensions of semiconductor devices are scaled down, it has become increasingly difficult to obtain via holes and contact holes in desired processed states. As an example, a description is given of the formation of a via hole that reaches an interconnect line (wiring) of copper.

A via hole is usually formed in the following manner: First, a stopper insulating film (e.g., a silicon nitride film) is formed on a region formed with a copper interconnect line. Then, an interlayer insulating film is formed on the stopper insulating film. Next, a hole is formed in the interlayer insulating film by etching it using a photoresist as a mask. At this point, the stopper insulating film serves as etching stopper. After the removal of the photoresist, the stopper insulating film is subjected to a plasma anisotropic etching process using a fluorocarbon-based gas, thereby exposing the surface of the copper interconnect line. Consequently the via hole is formed.

However, after the etching of the stopper insulating film using the fluorocarbon-based gas, a deposit containing fluorine remains on the surface of the copper interconnect line. After that, while the resulting structure is carried to a wet processing system such as a chemical cleaning system, fluorine contained in the deposit reacts with moisture in the atmosphere to form hydrofluoric acid (HF). The presence of fluorine or hydrofluoric acid results in the occurrence of copper corrosion; that is, copper compounds are produced or copper is corroded. This prevents via metal from being formed properly in the via hole, causing connection failures, such as an increase in via resistance. Such problems of corrosion resulting from fluorine can also arise in the case of other metals than copper and metal silicides.

Thus, if, in forming via and contact holes, the stopper insulating film is etched by plasma etching using a fluorine-containing gas such as a fluorocarbon-based gas, corrosion occurs due to fluorine, making it difficult to produce via and contact holes in a desired processed state and causing connection failures.

As can be seen from the foregoing, with plasma etching using a fluorine-containing gas, it is difficult to obtain a desired processed state due to various problems; therefore, it is difficult to manufacture semiconductor devices which are excellent in characteristics and reliability.

BRIEF SUMMARY OF THE INVENTION

According to a first aspect of the invention, there is provided a method of manufacturing a semiconductor device comprising: forming a gate structure on a major surface of a semiconductor substrate with a gate insulating film interposed therebetween; forming a first insulating film to cover top and side surfaces of the gate structure and the major surface of the semiconductor substrate; reforming portions of the first insulating film which cover the top surface of the gate structure and the major surface of the semiconductor substrate by an anisotropic plasma process using a gas not containing fluorine; and removing the reformed portions of the first insulating film.

According to a second aspect of the invention, there is provided a method of manufacturing a semiconductor device comprising: forming a conducting portion containing metal on or above a semiconductor substrate; forming a first insulating film on the conducting portion; forming a second insulating film on the first insulating film; removing a portion of the second insulating film to expose a portion of the first insulating film; reforming the exposed portion of the first insulating film by an anisotropic plasma process using a gas not containing fluorine; and removing the reformed portion of the first insulating film.

According to a third aspect of the invention, there is provided a method of manufacturing a semiconductor device comprising: forming a first insulating film on or above a semiconductor substrate; reforming the first insulating film by an anisotropic plasma process using a gas not containing fluorine; and removing the reformed first insulating film, wherein reforming the first insulating film and removing the reformed first insulating film are repeated at least two times.

BRIEF DESCRIPTION OF THE SEVERAL VIEWS OF THE DRAWING

FIGS. 4 through 8 are schematic sectional views illustrating a method of manufacturing a semiconductor device in accordance with a fourth embodiment of the present invention;

FIG. 9 shows a schematic configuration of manufacturing equipment adapted for the semiconductor device manufacturing method according to the fourth embodiment of the present invention;

DETAILED DESCRIPTION OF THE INVENTION

The embodiments of the invention will be described hereinafter with reference to the accompanying drawings.

Embodiment 1

A semiconductor device manufacturing method according to a first embodiment of the invention will be described with reference to sectional views shown in FIGS. 1, 2 and 3.

Figure 1:
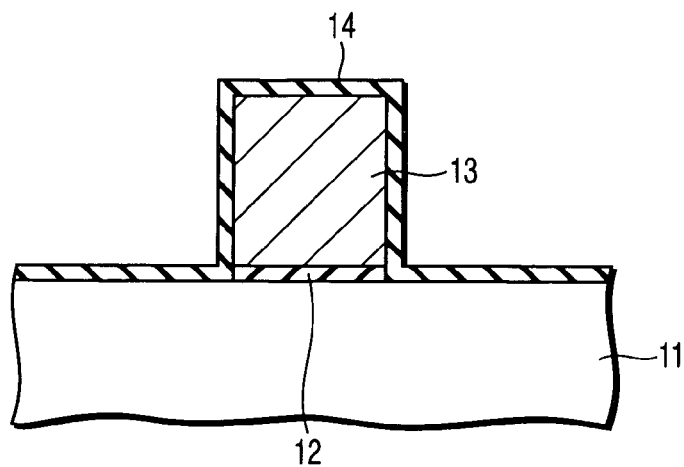
FIGS. 1, 2 and 3 are schematic sectional views illustrating methods of manufacturing semiconductor devices in accordance with first, second and third embodiments of the present invention.

First, as shown in FIG. 1, a silicon substrate (semiconductor substrate) 11 is formed on top with a gate insulating film 12 and a gate electrode (gate interconnect line) 13 is formed on the gate insulating film as a gate structure. The gate insulating film 12 is formed of silicon oxide and the gate electrode 13 is formed of polysilicon. Although the gate insulating film 12 is shown here processed into the shape of gate together with the gate electrode 13, it may be left unprocessed to cover the entire major surface of the silicon substrate 11. Subsequently, a spacer insulating film (first insulating film) 14 having a thickness of 10 nm and formed of silicon nitride is formed so as to cover the surface (top and side surfaces) of the gate electrode 13 and the surface (major surface) of the silicon substrate 11.

Figure 2:
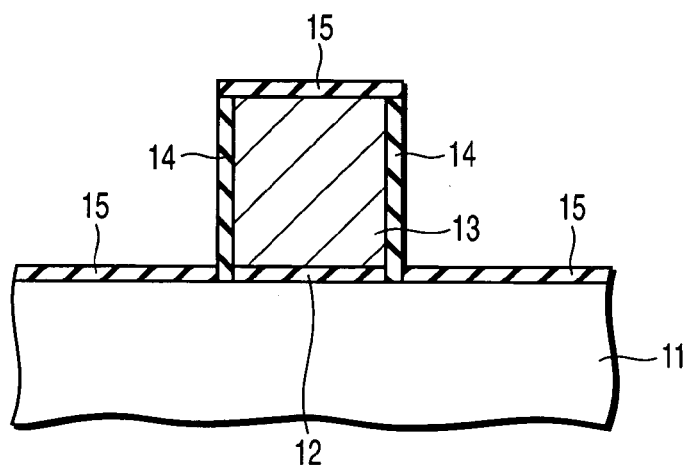

Next, as shown in FIG. 2, an oxygen ($O_2$) plasma process as anisotropic plasma processing is carried out. For the oxygen plasma process, a plasma processing apparatus is used which has the same configuration as a parallel plate type of RIE apparatus. Alternatively, a plasma processing apparatus may be used which has the same configuration as an ICP or ECR type of RIE apparatus. Since the oxygen plasma process is anisotropic, oxygen ions are supplied from a direction substantially vertical to the major surface of the silicon substrate 11. For this reason, many oxygen ions are implanted (introduced) into a portion of the silicon nitride film 14 which covers the top of the gate electrode 13 and a portion which covers the major surface of the semiconductor substrate. However, a portion of the silicon nitride film which covers the side of the gate electrode 13 is implanted with few oxygen ions. As the result, the portions of the silicon nitride film 14 which cover the top of the gate electrode 13 and major surface of the semiconductor substrate are selectively oxidized to form reformed (modified) layers 15 formed of silicon nitride film which contain a large quantity of oxygen.

Figure 3:
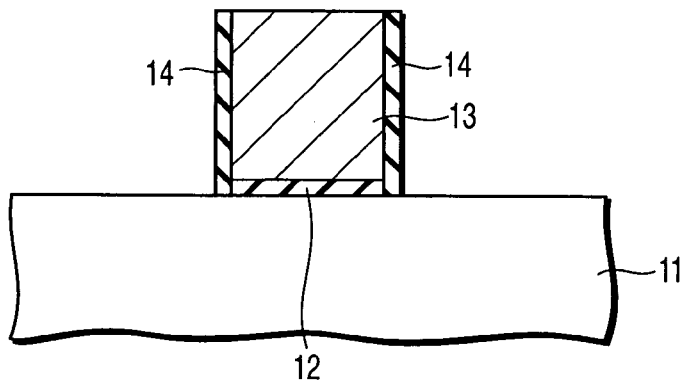

Next, as shown in FIG. 3, a wet etching process using dilute hydrofluoric acid is carried out. The use of dilute hydrofluoric acid allows the reformed layers 15 to be etched selectively with respect to the silicon nitride film 14 and the silicon substrate 11. As the result, that portion of the silicon nitride film 14 which is formed on the side of the gate electrode 13 is left to form a sidewall spacer on the side of the gate electrode 13. Though not shown in particular, the sidewall spacer thus formed is used as a mask in a subsequent process for ion implantation of impurities into the silicon substrate 11 to form source/drain regions.

As described above, with this embodiment, the spacer insulating film (silicon nitride film) 14 is processed without using a fluorocarbon-based gas. In processing the spacer insulating film by means of plasma etching using a fluorocarbon-based gas, even if the entire surface of the silicon substrate is covered with the gate insulating film, it is difficult to maintain compatibility of high etch selectivity (selective ratio) with vertical processability. According to this embodiment, by first carrying out anisotropic oxygen plasma processing, portions of the silicon nitride film 14 which are formed on other than the side of the gate electrode 13 are oxidized to form the reformed layers 15. Then, by removing the reformed layers 15 by means of isotropic wet etching, the sidewall spacer is formed. Since the oxygen plasma processing is not to remove the silicon nitride film 14, the vertical profile of the portion of the silicon nitride film formed on the side of the gate electrode 13 is maintained as a matter of course. In the process of removing the reformed layers 15, isotropic etching is simply performed taking only etch selectivity into consideration. By using an etchant of high etch selectivity, therefore, the reformed layers 15 can be selectively removed with the silicon substrate 11 little etched. Thus, in this embodiment, the sidewall spacer is formed by using a two-step process of forming reformed layers and removing the reformed layers. Thereby, a sidewall spacer vertical in profile can be formed with the silicon substrate little etched and semiconductor devices excellent in characteristics and reliability can be produced.

In the oxygen plasma processing, the oxygen ion implanted depth in the silicon nitride film 14 is determined by the energy of oxygen ions. Thus, by controlling the power of oxygen plasma, it becomes possible to exactly control (set) the depth (thickness) of the reformed layers 15 to a desired depth (thickness). In the oxygen plasma processing, therefore, it is possible to oxidize only the silicon nitride film 14 without oxidizing the silicon substrate 11. In the wet etching processing, therefore, it is possible to prevent the surface of the silicon substrate 11 from being etched.

Embodiment 2

A semiconductor device manufacturing method according to a second embodiment of the invention will be described with reference to the sectional views shown in FIGS. 1, 2 and 3.

First, as shown in FIG. 1, as in the first embodiment, a silicon substrate (semiconductor substrate) 11 is formed on top with a gate insulating film 12 and then a gate electrode (gate interconnect line) 13 is formed on the gate insulating film. Subsequently, a spacer insulating film (first insulating film) 14 is formed so as to cover the surface (top and side surfaces) of the gate electrode 13 and the surface (major surface) of the silicon substrate 11. In this embodiment, the spacer insulating film 14 is a silicon oxide film of 10 nm in thickness.

Next, as shown in FIG. 2, an anisotropic nitrogen ($N_2$) plasma process is carried out using the same type of plasma processing apparatus as in the first embodiment. Since this nitrogen plasma process is also anisotropic as with the oxygen plasma process in the first embodiment, nitrogen ions are supplied from a direction substantially vertical to the major surface of the silicon substrate 11. On the same principle as in the first embodiment, therefore, a portion of the silicon oxide film 14 which covers the top of the gate electrode 13 and a portion which covers the major surface of the semiconductor substrate are selectively nitrided to form reformed layers formed of silicon oxide films which contain a large quantity of nitrogen. As with the first embodiment, by controlling the plasma power, it becomes possible to exactly control the depth (thickness) of the reformed layers 15 to a desired depth. It is possible to selectively nitride only the silicon oxide film 14 without nitriding the silicon substrate 11.

Next, as shown in FIG. 3, a high-temperature wet etching process using hot phosphoric acid is carried out. The use of hot phosphoric acid allows the reformed layers 15 to be etched selectively with respect to the silicon oxide film 14 and the silicon substrate 11. As the result, only that portion of the silicon oxide film 14 which is formed on the side of the gate electrode 13 is left to form a sidewall spacer on the side of the gate electrode 13.

In the second embodiment, as in the first embodiment, the sidewall spacer is formed by using a two-step process of forming reformed layers and removing the reformed layers. Thereby, a sidewall spacer vertical in profile can be formed with the silicon substrate little etched.

Embodiment 3

A semiconductor device manufacturing method according to a third embodiment of the invention will be described with reference to the sectional views shown in FIGS. 1, 2 and 3.

First, as shown in FIG. 1, as in the first embodiment, a silicon substrate (semiconductor substrate) 11 is formed on top with a gate insulating film 12 and then a gate electrode (gate interconnect line) 13 is formed on the gate insulating film. Subsequently, a spacer insulating film (first insulating film) 14 is formed so as to cover the surface (top and side surfaces) of the gate electrode 13 and the surface (major surface) of the silicon substrate 11. In this embodiment, the spacer insulating film 14 is silicon nitride and has a thickness of 10 nm.

Next, as shown in FIG. 2, an anisotropic argon (Ar) plasma process is carried out using the same type of plasma processing apparatus as in the first embodiment. Since the argon plasma process is also anisotropic, Ar ions are supplied from a direction substantially vertical to the major surface of the silicon substrate 11. On the same principle as in the first embodiment, therefore, a portion of the silicon nitride film 14 which covers the top of the gate electrode 13 and a portion which covers the major surface of the semiconductor substrate are selectively implanted (introduced) with Ar ions to form reformed layers 15. As with the first embodiment, by controlling the plasma power, it becomes possible to exactly control the depth (thickness) of the reformed layers 15 to a desired depth. It is possible to selectively introduce Ar only into the silicon nitride film 14. When implanted with Ar, the reformed layers 15 suffer serious damage with the result that Si-N bonds in the silicon nitride film are broken and many dangling bonds are produced.

Next, as shown in FIG. 3, a wet etching process using dilute hydrofluoric acid is carried out. Normally, the silicon nitride film will not be etched by dilute hydrofluoric acid. However, since many dangling bonds are present in the reformed layers 15, etching is expected to occur. Therefore, the use of dilute hydrofluoric acid allows the reformed layers 15 to be etched selectively with respect to the silicon nitride film 14 and the silicon substrate 11. As the result, only that portion of the silicon nitride film 14 which is formed on the side of the gate electrode 13 is left to form a sidewall spacer.

In the third embodiment, as in the first embodiment, the sidewall spacer is formed by using a two-step process of forming reformed layers and removing the reformed layers. Thereby, a sidewall spacer vertical in profile can be formed with the silicon substrate little etched.

In this embodiment, the anisotropic argon plasma process is carried out to form reformed layers, however other rare gas than argon may be used to form reformed layers. Furthermore, the aforementioned anisotropic plasma process using rare gas is applicable to such structure as described in the second embodiment.

Embodiment 4

Next, a semiconductor device manufacturing method according to a fourth embodiment of the present invention will be described. In the first, second and third embodiments described above, the step of forming the reformed layers 15 shown in FIG. 2 and the step of removing the reformed layers 15 shown in FIG. 3 are each performed once. The thickness of an insulating film that can be reformed by plasma processing is normally about 10 nm or less. If the spacer insulating film 14 is thick, therefore, there arises the possibility that a single plasma processing step may fail to reform the spacer insulating film 14 entirely throughout its thickness. According to this embodiment, a sidewall spacer is finally formed on the side of a gate electrode (gate structure) by repeating the step of forming reformed layers and the step of removing the reformed layers at least two times.

FIGS. 4 through 8 are sectional views illustrating the semiconductor device manufacturing method of this embodiment. FIG. 9 schematically shows the configuration of a manufacturing system adapted to the manufacturing method illustrated in FIGS. 4 through 8. The semiconductor device manufacturing method of this embodiment will be described hereinafter with reference to these drawings.

Figure 4:
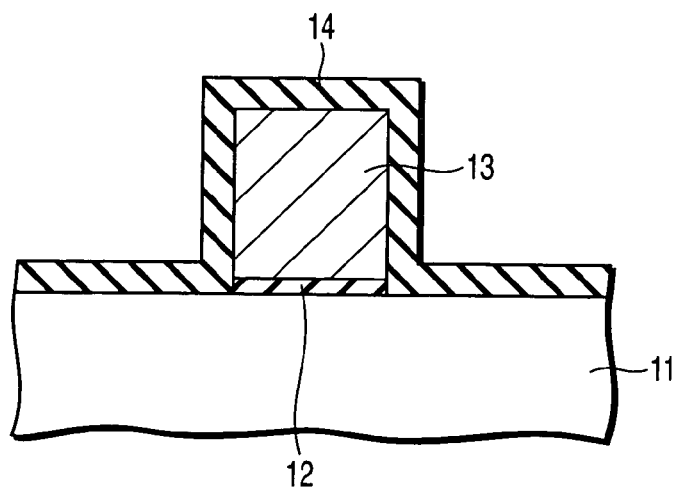

First, as shown in FIG. 4, as in the first embodiment, a silicon substrate 11 is formed on top with a gate insulating film 12 and then a gate electrode 13 is formed on the gate insulating film. After that, a spacer insulating film 14 formed of silicon nitride is formed. In this embodiment, the thickness of the silicon nitride film 14 is thicker than in the first embodiment, of the order of, say, 20 nm.

Figure 5:
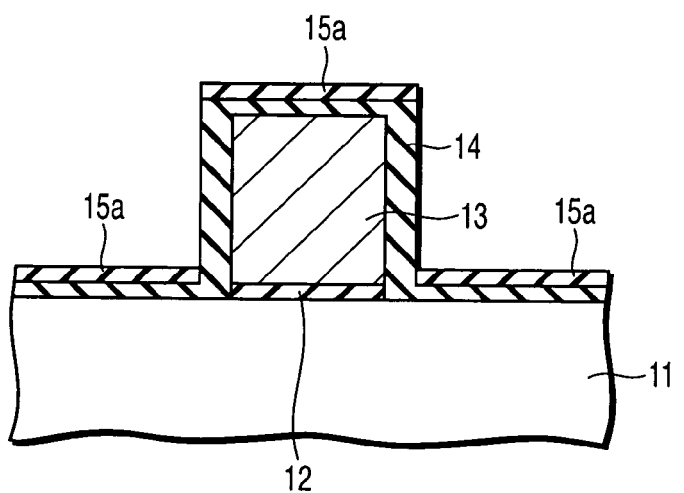

Next, the processed substrate thus obtained is placed in a load-lock chamber 101. Subsequently, a gate valve 102 is opened to move the processed substrate to a carrier chamber 104 by a carrier robot 103. After the gate valve 102 has been closed, the carrier chamber 104 is vacuum-evacuated through an exhaust line 105. A gate valve 106 is next opened to move the processed substrate to a plasma processing chamber 107. After the gate valve 106 has been closed, an anisotropic oxygen plasma process is carried out in the plasma processing chamber 107 as in the first embodiment. As the result, as shown in FIG. 5, a portion of the silicon nitride film 14 which covers the top of the gate electrode 13 and a portion which covers the major surface of the semiconductor substrate are selectively oxidized to form reformed layers 15a formed of silicon nitride containing a large quantity of oxygen. In this embodiment, however, since the silicon nitride film 14 is thick, it is reformed in its upper half portion in the direction of thickness.

After such a plasma process, the gate valve 106 is opened to move the processed substrate to the carrier chamber 104. After the gate valve 106 has been closed, a nitrogen gas is introduced into the carrier chamber 104 through a purge line 108 to set the pressure in the chamber 104 to the atmospheric pressure.

Figure 6:
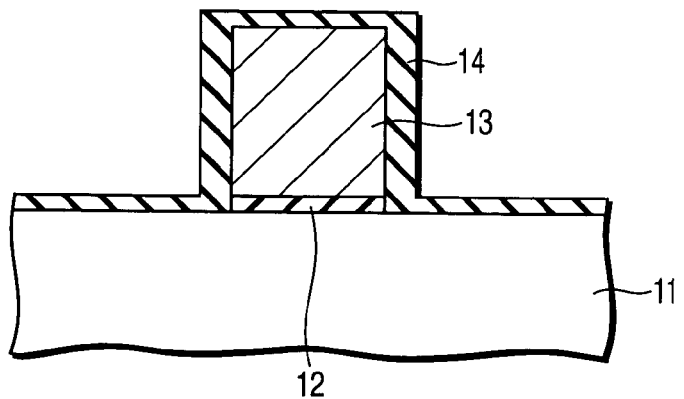

Next, a gate valve 109 is opened to move the processed substrate to an etching chamber 110. After the gate valve 109 has been closed, an HF vapor process is carried out in the etching chamber 110. As in the case of the dilute hydrofluoric acid processing in the first embodiment, even this HF vapor process allows isotropic selective etching of the reformed layers 15a. As the result, the reformed layers 15a are selectively removed as shown in FIG. 6.

Next, the gate valve 109 is opened to move the processed substrate to the carrier chamber 104. After that, the processed substrate is moved to the plasma processing chamber 107 in the same procedure as described above and then an anisotropic oxygen plasma process is carried out again in the chamber 107. As the result, as shown in FIG. 7, a portion of the silicon nitride film 14 which covers the top of the gate electrode 13 and a portion which covers the major surface of the semiconductor substrate are selectively oxidized to form reformed layers 15b formed of silicon nitride containing a large quantity of oxygen. Since the reformed layers 15a have been removed, the thickness of the silicon nitride film 14 has been reduced. Therefore, the silicon nitride film is entirely oxidized in regions where the reformed layers 15b are to be formed.

Next, the processed substrate is moved via the carrier chamber 104 to the etching chamber 110 in the same procedure as described above. Then, an HF vapor process is carried out again in the etching chamber 110. As the result, as shown in FIG. 8, the reformed layers 15b are etched selectively with respect to the silicon nitride film 14 and the silicon substrate 11 to form a sidewall spacer on the side of the gate electrode 13.

Although the embodiment has been described in terms of the case where the number of times the step of forming reformed layers and the step of removing the reformed layers are repeated is two, this is not restrictive. If the spacer insulating film is thicker, the steps of forming and removing reformed layers may be repeated three or more times. If the spacer insulating film is formed with the entire major surface of the silicon substrate 11 covered with the gate insulating film, the gate insulating film may be processed by repeating the step of forming reformed layers and the step of removing the reformed layers.

In the fourth embodiment, as in the first embodiment, a sidewall spacer vertical in profile can be formed with the silicon substrate little etched. Moreover, by repeating the step of forming reformed layers and the step of removing the reformed layers, the sidewall spacer can be formed on the side of the gate electrode with certainty even if the spacer insulating film is thick. By controlling the plasma power in each step of forming reformed layers, it becomes possible to exactly control the depth (thickness) of the reformed layers 15 to a desired depth. It is therefore possible to selectively oxidize only the silicon nitride film 14 without oxidizing the silicon substrate 11 as in the first embodiment. The use of such equipment as shown in FIG. 9 allows the step of forming reformed layers and the step of removing the reformed layers to be repeated successively and efficiently, leading to an increase in throughput. In particular, the use of vapor as an etchant in removing the reformed layers facilitates drying after the reformed layers have been removed, which is useful in improving throughput.

In this embodiment, vapor HF is used to remove the reformed layers 15a; however, since the underlying silicon substrate 11 is not exposed at this stage, dry etching based on a usual fluorocarbon-based gas may also be carried out. That is, by performing dry etching using, for example, a $C_4F_8$/CO/Ar mixed gas, the reformed layers 15a, which are oxidized silicon nitride, can be selectively etched away with respect to the silicon nitride film 14. Thus, the anisotropic oxygen plasma processing and the dry etching using a fluorocarbon-based gas can be performed successively in the plasma processing chamber 107, allowing throughput to be further increased.

The aforementioned method, i.e., the method of processing an insulating film by repeating the step of forming a reformed layer and the step of removing the reformed layer, can be applied to various insulating film processing processes other than the aforementioned process of forming a sidewall spacer.

Embodiment 5

A semiconductor device manufacturing method according to a fifth embodiment of the invention will be described with reference to sectional views shown in FIGS. 10 through 14.

Figure 10:
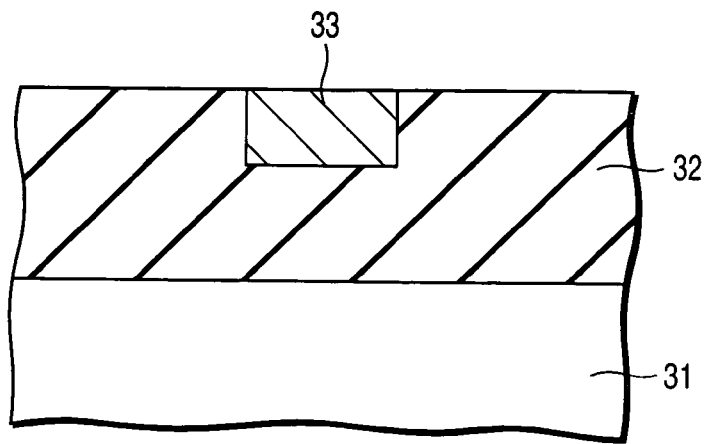
FIGS. 10 through 14 are schematic sectional views illustrating a method of manufacturing a semiconductor device in accordance with a fifth embodiment of the present invention.

First, as shown in FIG. 10, a copper interconnect line (conducting portion) 33 is formed above a silicon substrate (semiconductor substrate) 31. Although, in the example shown, the copper interconnect line 33 is formed in a first-level interlayer insulating film 32 formed on the silicon substrate 31, it may be formed in a second- or higher-level interlayer insulating film.

Figure 11:
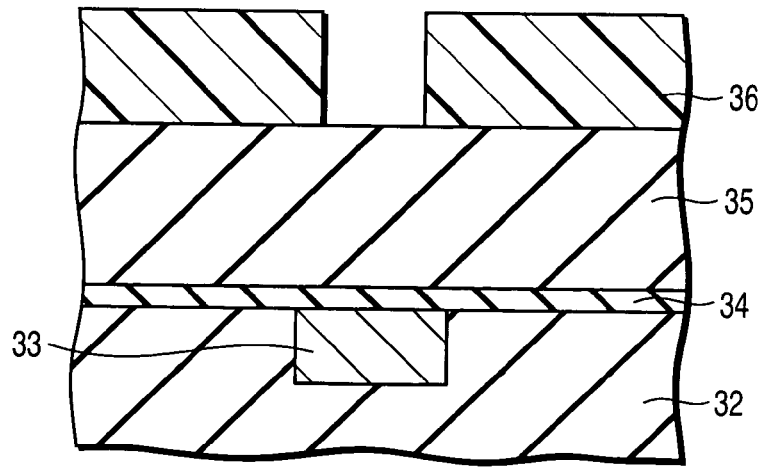

Next, as shown in FIG. 11, a silicon nitride film of 30 nm in thickness as a stopper insulating film (first insulating film) 34 is formed on the interlayer insulating film 32 and the copper interconnect line 33. Then, an interlayer insulating film (second insulating film) 35 is formed on the stopper insulating film 34. The stopper insulating film 34 functions as an etching stopper in forming a hole in the interlayer insulating film 35 in a step to be described later and as a diffusion barrier to suppress the diffusion of copper in the copper interconnect line 33. Subsequently, a photoresist pattern 36 for the formation of a via hole is formed on the interlayer insulating film 35 by means of lithographic techniques.

Figure 12:
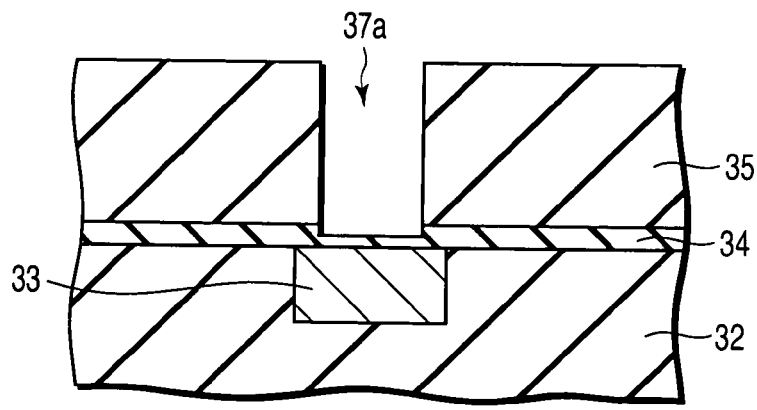

Next, as shown in FIG. 12, the interlayer insulating film 35 is etched through anisotropic plasma etching using the photoresist pattern 36 as a mask. Thereby, the stopper insulating film 34 is exposed and a hole 37a is formed in the interlayer insulating film 35. Although, at this point, the stopper insulating film 34 functions as etching stopper, it is also subjected to etching due to over etching; thus, its thickness is reduced to about 10 nm. Then, the photoresist pattern 36 is removed by ashing.

Figure 13:
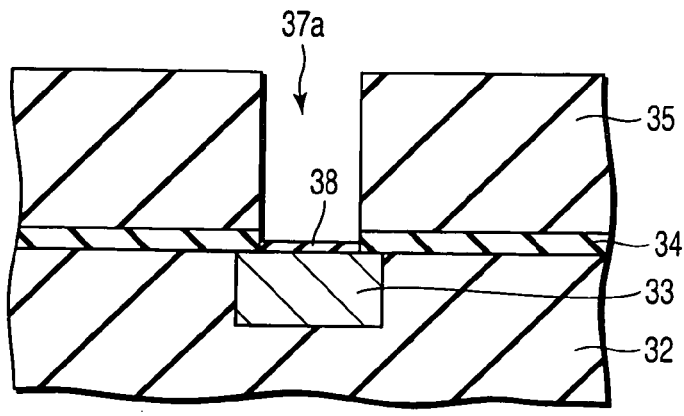

Next, as shown in FIG. 13, an anisotropic oxygen ($O_2$) plasma process is carried out. For this plasma process, the same plasma processing equipment as described in the first embodiment can be used. The oxygen plasma process oxidizes the stopper insulating film (silicon nitride film) 34 to form a reformed layer 38. Since this oxygen plasma process is anisotropic, oxygen ions are supplied from a direction substantially vertical to the major surface of the silicon substrate 11, i.e., from a direction substantially vertical to the surface of the stopper insulating film 34. For this reason, oxygen ions are implanted (introduced) into only that portion of the stopper insulating film 34 which corresponds to the hole 37a, whereby the reformed layer 38 is formed. In this embodiment, as in the first embodiment, by controlling the plasma power, it becomes possible to exactly control the depth (thickness) of the reformed layer 38 to a desired depth. It is possible to selectively oxidize only the silicon nitride film 34 without oxidizing the copper interconnect line 33.

Figure 14:
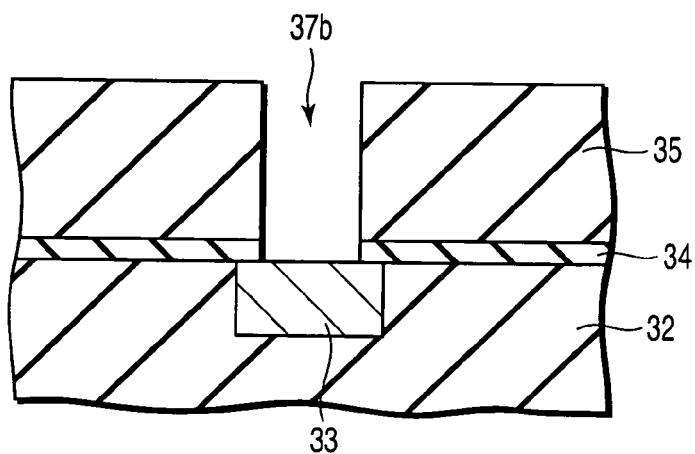

Next, as shown in FIG. 14, a wet etching process using dilute hydrofluoric acid is carried out to selectively remove the reformed layer 38. Then, the surface of the exposed copper interconnect line 33 is quickly cleaned with a chemical. Thereby, the via hole 37b is formed. Since the surface of the copper line 33 is not exposed to a fluorine-containing gas unlike the conventional process, no corrosion caused by fluorine will occur, so that the copper line is kept clean. Though not shown in particular, the via hole 37b thus formed is filled in a subsequent step with a metal material to form a via plug.

As described above, in the fifth embodiment, the stopper insulating film (silicon nitride film) 34 is processed without using any fluorocarbon-based gas, allowing the prevention of occurrence of corrosion due to fluorine. For this reason, the surface of the copper interconnect line 33 can be kept clean, allowing the prevention of occurrence of connection failures. Thus, the fifth embodiment removes the stopper insulating film by using a two-step process of first forming a reformed layer and then removing the reformed layer. Thereby, the occurrence of corrosion can be prevented surely, which allows a via hole in a desired processed state to be formed with precision and semiconductor devices excellent in characteristics and reliability to be manufactured.

Although the fifth embodiment has been described taking an interconnect line made of Cu as a conducting portion by way of example, other metal than Cu may be used to form the conducting portion. A metal silicide may also be used to form a conducting portion. In either case, the occurrence of corrosion due to fluorine can be prevented by using the same method as described above. For example, in a case as well where an Al interconnect line or a metal silicide layer formed in the source/drain regions of a MIS transistor is used as a conducting portion, a stopper insulating film is formed on the conducting portion, thus allowing the same method as described above to be used.

Figure 15:
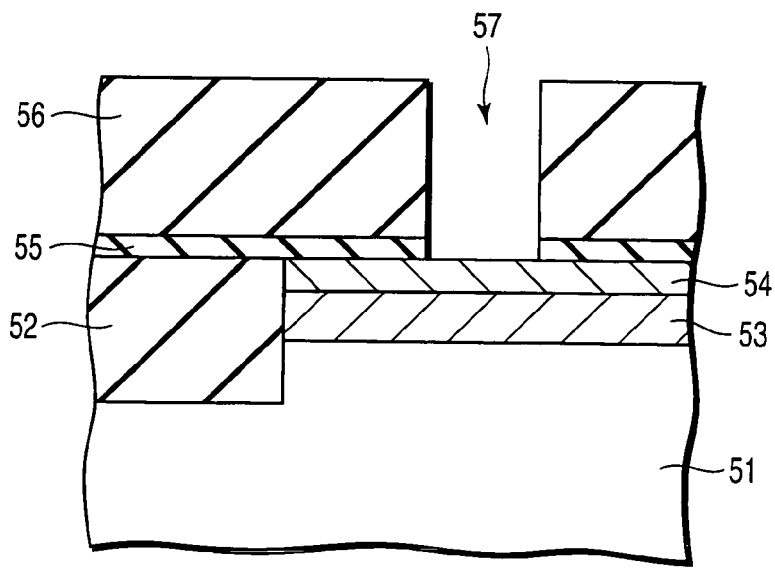
FIG. 15 is a schematic sectional view illustrating a modification of the method of manufacturing a semiconductor device according to the fifth embodiment of the present invention.

FIG. 15 shows an example of using a metal silicide layer formed in the source/drain regions of a MIS transistor as a conducting portion. A silicon substrate (semiconductor substrate) 51 formed with an isolation region 52 and source/drain diffusion layers 53 is formed on top with a metal silicide layer (for example, Ni or Co silicide layer) 54 as a conducting portion. Further, a stopper insulating film (for example, silicon nitride film) 55 and an interlayer insulating film 56 are formed in sequence. After that, a hole is formed in the interlayer insulating film 56 using the stopper insulating film 55 as etching stopper in the same manner as described above. Subsequently, an anisotropic plasma process is carried out to reform the stopper insulating film 55. The reformed stopper insulating film is then removed through wet etching, whereby a contact hole 57 is formed. Thus, by using the same method as described above in the case where a metal silicide film is used as a conducting portion, the same advantages as in the fifth embodiment described above can be obtained.

Although the fifth embodiment has been described in terms of the formation of a via or contact hole, the principles of the embodiment are applicable to a dual damascene process which involves forming trenches for interconnect lines in addition to holes and filling the holes and the trenches with a conducting material at the same time.

In this embodiment, the step of forming a reformed layer and the step of removing the reformed layer are each performed once. In a case where the stopper insulating film is thick, however, the reformed layer forming step and the reformed layer removing step may be repeated in the same manner as described in the fourth embodiment.

Embodiment 6

A semiconductor device manufacturing method according to a sixth embodiment of the invention will be described with reference to sectional views shown in FIGS. 16 through 19.

Figure 16:
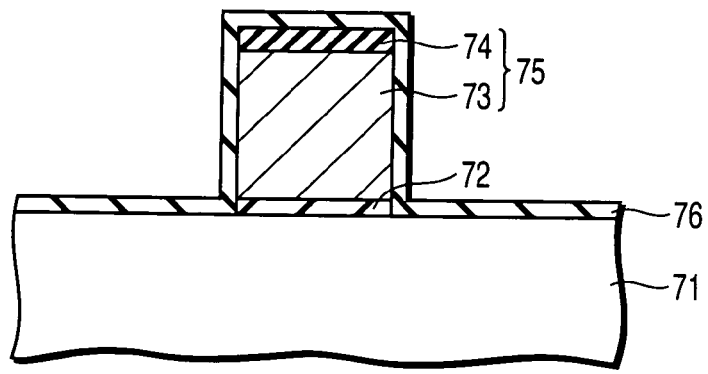
FIGS. 16 through 19 are schematic sectional views illustrating a method of manufacturing a semiconductor device in accordance with a sixth embodiment of the present invention.

First, as shown in FIG. 16, a silicon substrate (semiconductor substrate) 71 is formed on top with a gate insulating film 72 and a gate structure 75 is formed on the gate insulating film. The gate structure 75 is formed of a gate electrode (gate interconnect line) 73 formed on the gate insulating film 72 and a hard mask film 74 formed on the gate electrode 73. The gate insulating film 72 is formed of silicon oxide and the gate electrode 73 is formed of polysilicon. Although the gate insulating film 72 is shown here processed into the shape of gate together with the gate electrode 73, it may be left unprocessed to cover the entire major surface of the silicon substrate 71. Subsequently, a spacer insulating film (first insulating film) 76 having a thickness of 10 nm or less and formed of silicon nitride is formed so as to cover the surface (top and side surfaces) of the gate structure 75 and the surface (major surface) of the silicon substrate 71.

Figure 17:
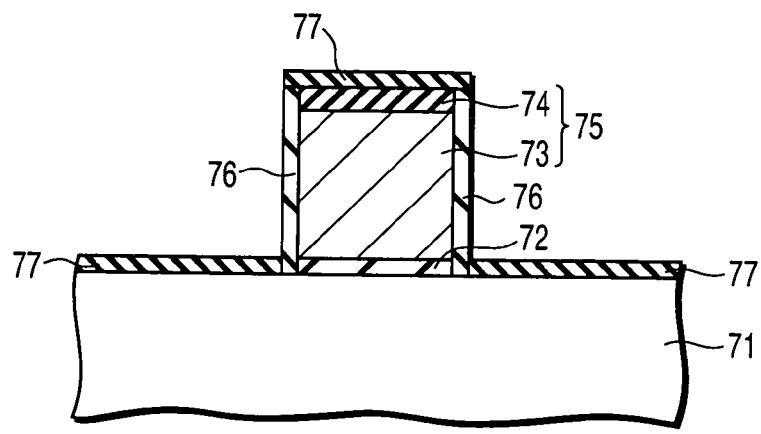

Next, as shown in FIG. 17, an anisotropic hydrogen ($H_2$) plasma process is carried out using the same type of plasma processing apparatus as in the first embodiment. Since the hydrogen plasma process is also anisotropic as with the oxygen plasma processing in the first embodiment, hydrogen ions are supplied from a direction substantially vertical to the major surface of the silicon substrate 71. On the same principle as in the first embodiment, therefore, a portion of the silicon nitride film 76 which covers the top of the gate structure 75 and a portion which covers the major surface of the semiconductor substrate 71 are selectively implanted (introduced) with hydrogen to form reformed layers 77. As with the first embodiment, by controlling the plasma power, it becomes possible to exactly control the depth (thickness) of the reformed layers 77 to a desired depth. It is possible to selectively introduce hydrogen only into the silicon nitride film 76. When implanted with hydrogen, the reformed layers 77 suffer serious damage with the result that Si—N bonds in the silicon nitride film are broken to produce many dangling bonds.

Figure 18:
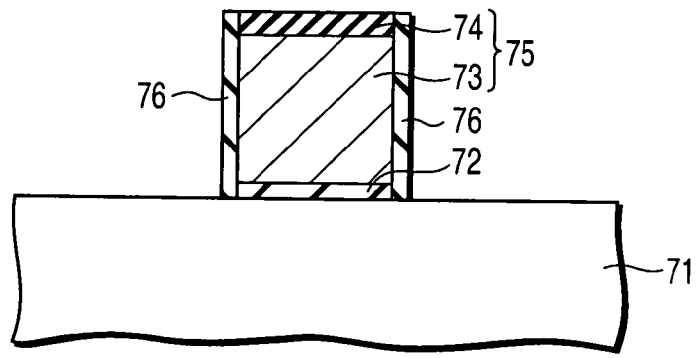

Next, as shown in FIG. 18, a wet etching process using dilute hydrofluoric acid is carried out, which allows the reformed layers 77 to be selectively etched away with respect to the silicon nitride film 76 and the silicon substrate 71. As the result, that portion of the silicon nitride film 76 which is formed on the side of the gate structure 75 is left to form a sidewall spacer.

The reason why the reformed layers 77 are etched away through wet etching using dilute hydrofluoric acid is considered as follows: As described above, the reformed layers 77 are seriously damaged by being implanted with hydrogen and consequently many dangling bonds are formed. It is thought that oxygen associates with the dangling bonds for some cause and hence the etch rate of dilute hydrofluoric acid etching increases. For instance, a trace amount of oxygen is present in the hydrogen plasma processing chamber and considered to associate with the dangling bonds. It is also thought that, when the substrate is taken out of the hydrogen plasma processing chamber, oxygen associates with the dangling bonds. For these reasons, it is thought that oxygen is incorporated into the reformed layers 77 and consequently the reformed layers 77 become etchable in dilute hydrofluoric acid.

Figure 19:
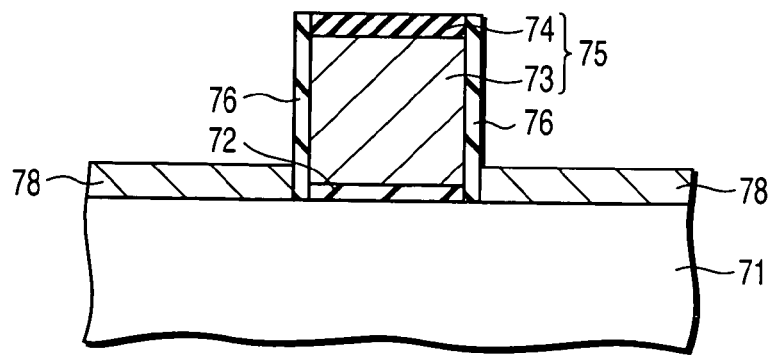

Next, as shown in FIG. 19, an epitaxial silicon film (epitaxial semiconductor film) 78 is formed on the exposed surface of the silicon substrate 71. Since the gate electrode (polysilicon film) 73 is covered with the hard mask film 74 and the spacer insulating film 76, the epitaxial silicon film 78 can be formed selectively only on the exposed surface of the silicon substrate 71.

When an oxygen plasma process is carried out as anisotropic plasma processing in place of the hydrogen plasma process in the step of FIG. 17, there is the possibility that the following situation may occur. In the case of oxygen plasma processing, since oxygen is larger in mass than hydrogen, the gate structure 75 is prone to suffer sputtering in its upper corner portion (shoulder portion). For this reason, sputtering may scrape the hard mask film 74 and the spacer insulating film 76 near the upper corner portion of the gate structure 75 to thereby expose the upper corner portion of the gate electrode 73. As the result, in forming the epitaxial silicon film on the exposed surface of the silicon substrate 71 in the step of FIG. 19, a silicon film may be formed on the upper corner portion of the gate electrode 73 made of polysilicon. In this embodiment, since anisotropic plasma processing is carried out using hydrogen small in mass, such a situation can be avoided.

Though not shown in particular, in a step subsequent to the step of FIG. 19, ion implantation of impurities is carried out using the sidewall spacer as a mask to form source/drain regions (extension regions). Thereby, a MIS transistor is formed which has an elevated source/drain extension structure.

In the sixth embodiment, as in the first embodiment, the sidewall spacer is formed by using a two-step process of forming reformed layers and removing the reformed layers. Thereby, a sidewall spacer vertical in profile can be formed with the silicon substrate little etched.

In this embodiment, since anisotropic plasma processing is carried out using hydrogen small in mass, the sputtering action of the plasma processing can be suppressed. For this reason, in forming the elevated source/drain extension structure, only the surface of the silicon substrate 71 can be exposed with certainty and an epitaxial silicon film can be formed selectively on the exposed surface of the silicon substrate 71.

The aforementioned anisotropic hydrogen plasma processing is applicable to such structures as described in the first and third embodiments. In addition, the anisotropic hydrogen plasma processing is applicable to the method described in the fourth embodiment, that is, the method by which the step of forming reformed layers and the step of removing the reformed layers are repeated. Furthermore, the anisotropic hydrogen plasma processing is also applicable to the structure and method described in the fifth embodiment.

Embodiment 7

As described in the fourth embodiment, it is possible to remove a reformed layer by using dry etching. A method using dry etching will be described below.

First, as shown in FIG. 4, as in the first embodiment, a silicon substrate 11 is formed on top with a gate insulating film 12 and then a gate electrode 13 is formed, and subsequently a silicon nitride film as a spacer insulating film 14 is formed. In this embodiment, the silicon nitride film 14 is about 12 nm in thickness, which is slightly larger than the silicon nitride film 14 in the first embodiment.

Next, an anisotropic oxygen plasma process is carried out as in the first embodiment. As the result, as shown in FIG. 5, on the same principle as in the first embodiment, a portion of the silicon nitride film 14 which covers the top of the gate electrode 13 and a portion which covers the major surface of the semiconductor substrate 11 are selectively oxidized to form reformed layers 15a formed of silicon nitride films which contain a large quantity of oxygen. In this embodiment, the thickness of the silicon nitride film is reformed for about 10 nm out of 12 nm.

After the plasma process has been performed in this manner, a dry etching process using mixed gas of, for example, $CHF_3$ and Ar is performed in the same chamber. Plasma emission occurring during the dry etching process is monitored. The emission near a wavelength of 387 nm is caused by a C—N bond in the plasma, and the emission intensity changes when the quantity of nitrogen in the film varies. Therefore, increase in the emission intensity near 387 nm is detected, so that the endpoint can be detected. In other words, when the reformed layers 15a which contain a large quantity of oxygen and whose nitrogen ratio is low are removed, the surface of the silicon nitride film 14 which has not been reformed is exposed. It is possible to detect the exposed point as the endpoint. Even when over-etching is performed, about 1 nm of the silicon nitride film can be left. About 1 nm of the silicon nitride film which has been left can be isotropically removed by, for example, a wet process using hot phosphoric acid. Although the width (thickness) of the sidewall formed of the silicon nitride film 14 is slightly smaller, the formation of the sidewall is possible.

From another standpoint, this embodiment indicates a depth control method in dry etching. That is, a combination of dry etching the reformed layer following the anisotropic plasma processing for reforming with a desired depth and endpoint detection thereof enables to perform dry etching process until just before exposure of the underlying region, which would provide a new dry etching method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

forming a gate structure on a major surface of a semiconductor substrate with a gate insulating film interposed therebetween;

forming a first insulating film to cover top and side surfaces of the gate structure and the major surface of the semiconductor substrate;

reforming portions of the first insulating film which cover the top surface of the gate structure and the major surface of the semiconductor substrate by an anisotropic plasma process using a gas not containing fluorine without reforming the semiconductor substrate; and removing the reformed portions of the first insulating film, wherein the first insulating film is formed of silicon nitride, and reforming the portions of the first insulating film includes introducing hydrogen into the portions of the first insulating film.

2. The method according to claim 1, wherein reforming the portions of the first insulating film includes oxidizing, nitriding, or damaging the portions of the first insulating film.

3. The method according to claim 1, wherein removing the reformed portions of the first insulating film is carried out by a wet process.

4. The method according to claim 1, wherein reforming the portions of the first insulating film includes controlling a plasma power in the anisotropic plasma process to form a reformed layer having a desired depth.

5. The method according to claim 1, further comprising forming an epitaxial semiconductor film on the major surface of the semiconductor substrate which has become exposed by removing the reformed portions of the first insulating film.

6. The method according to claim 1, wherein removing the reformed portions of the first insulating film includes removing the reformed portions of the first insulating film to leave only portions of the first insulating film which cover the side surfaces of the gate structure.

* * * * *